(12) United States Patent
Gale et al.

(10) Patent No.: US 7,250,374 B2
(45) Date of Patent: Jul. 31, 2007

(54) SYSTEM AND METHOD FOR PROCESSING A SUBSTRATE USING SUPERCRITICAL CARBON DIOXIDE PROCESSING

(75) Inventors: Glenn Gale, Tokyo (JP); Joseph T. Hillman, Scottsdale, AZ (US); Gunilla Jacobson, Gilbert, AZ (US); Bentley Palmer, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 206 days.

(21) Appl. No.: 10/881,456

(22) Filed: Jun. 30, 2004

(65) Prior Publication Data

US 2006/0003592 A1 Jan. 5, 2006

(51) Int. Cl.
*H01L 21/302* (2006.01)
*H01L 21/461* (2006.01)

(52) U.S. Cl. ............................ 438/745; 438/689
(58) Field of Classification Search ........... 438/689, 438/745
See application file for complete search history.

(56) References Cited

U.S. PATENT DOCUMENTS

| | | | | |
|---|---|---|---|---|
| 2,617,719 A | 11/1952 | Stewart | ................... | 23/312 |
| 2,625,886 A | 1/1953 | Browne | ................... | 103/150 |
| 3,744,660 A | 7/1973 | Gaines et al. | ................... | 220/10 |
| 3,968,885 A | 7/1976 | Hassan et al. | ................... | 214/1 BC |
| 4,029,517 A | 6/1977 | Rand | ................... | 134/11 |
| 4,091,643 A | 5/1978 | Zucchini | ................... | 68/18 C |
| 4,245,154 A | 1/1981 | Uehara et al. | ................... | 250/227 |
| 4,341,592 A | 7/1982 | Shortes et al. | ................... | 156/643 |
| 4,355,937 A | 10/1982 | Mack et al. | ................... | 414/217 |
| 4,367,140 A | 1/1983 | Wilson | ................... | 210/110 |
| 4,406,596 A | 9/1983 | Budde | ................... | 417/393 |
| 4,422,651 A | 12/1983 | Platts | ................... | 277/206 R |

(Continued)

FOREIGN PATENT DOCUMENTS

CH 251213 8/1948

(Continued)

OTHER PUBLICATIONS

J. B. Rubin et al., A Comparison of Chilled DI Water/Ozone and $CO_2$-based Supercritical Fluids as Replacements for Photoresist-Stripping Solvents, IEEE/CPMT Int'l Electronics Manufacturing Technology Symposium, pp. 308-314, 1998.

(Continued)

*Primary Examiner*—Carl Whitehead, Jr.
*Assistant Examiner*—Heather Doty
(74) *Attorney, Agent, or Firm*—Wood, Herron & Evans, LLP

(57) ABSTRACT

A method and system for processing a substrate in a film removal system. The method includes providing the substrate in a substrate chamber of a film removal system, where the substrate has a micro-feature containing a dielectric film on a sidewall of the micro-feature and a photoresist film covering a portion the dielectric film, and performing a first film removal process using supercritical $CO_2$ processing to remove the portion of the dielectric film not covered by the photoresist film. Following the first film removal process, a second film removal process using supercritical $CO_2$ processing can be performed to remove the photoresist film. Alternately, wet processing can be used to perform one of the first film removal process or the second film removal process.

24 Claims, 6 Drawing Sheets

U.S. PATENT DOCUMENTS

| | | | |
|---|---|---|---|
| 4,474,199 A | 10/1984 | Blaudszun | 134/105 |
| 4,522,788 A | 6/1985 | Sitek et al. | 422/78 |
| 4,549,467 A | 10/1985 | Wilden et al. | 91/307 |
| 4,592,306 A | 6/1986 | Gallego | 118/719 |
| 4,601,181 A | 7/1986 | Privat | 68/18 C |
| 4,626,509 A | 12/1986 | Lyman | 435/287 |
| 4,670,126 A | 6/1987 | Messer et al. | 204/298 |
| 4,682,937 A | 7/1987 | Credle, Jr. | 417/393 |
| 4,693,777 A | 9/1987 | Hazano et al. | 156/345 |
| 4,749,440 A | 6/1988 | Blackwood et al. | 156/646 |
| 4,778,356 A | 10/1988 | Hicks | 417/397 |
| 4,788,043 A | 11/1988 | Kagiyama et al. | 422/292 |
| 4,789,077 A | 12/1988 | Noe | 220/319 |
| 4,823,976 A | 4/1989 | White, III et al. | 220/211 |
| 4,825,808 A | 5/1989 | Takahashi et al. | 118/719 |
| 4,827,867 A | 5/1989 | Takei et al. | 118/64 |
| 4,838,476 A | 6/1989 | Rahn | 228/180.1 |
| 4,865,061 A | 9/1989 | Fowler et al. | 134/108 |
| 4,879,431 A | 11/1989 | Bertoncini | 435/311 |
| 4,917,556 A | 4/1990 | Stark et al. | 414/217 |
| 4,924,892 A | 5/1990 | Kiba et al. | 134/123 |
| 4,944,837 A | 7/1990 | Nishikawa et al. | 156/646 |
| 4,951,601 A | 8/1990 | Maydan et al. | 118/719 |
| 4,960,140 A | 10/1990 | Ishijima et al. | 134/31 |
| 4,983,223 A | 1/1991 | Gessner | 134/25.4 |
| 5,011,542 A | 4/1991 | Weil | 134/38 |
| 5,013,366 A | 5/1991 | Jackson et al. | 134/1 |
| 5,044,871 A | 9/1991 | Davis et al. | 414/786 |
| 5,062,770 A | 11/1991 | Story et al. | 417/46 |
| 5,068,040 A | 11/1991 | Jackson | 210/748 |
| 5,071,485 A | 12/1991 | Matthews et al. | 134/2 |
| 5,105,556 A | 4/1992 | Kurokawa et al. | 34/12 |
| 5,143,103 A | 9/1992 | Basso et al. | 134/98.1 |
| 5,167,716 A | 12/1992 | Boitnott et al. | 118/715 |
| 5,169,296 A | 12/1992 | Wilden | 417/395 |
| 5,169,408 A | 12/1992 | Biggerstaff et al. | 29/25.01 |
| 5,185,296 A | 2/1993 | Morita et al. | 437/229 |
| 5,186,594 A | 2/1993 | Toshima et al. | 414/217 |
| 5,186,718 A | 2/1993 | Tepman et al. | 29/25.01 |
| 5,188,515 A | 2/1993 | Horn | 417/63 |
| 5,190,373 A | 3/1993 | Dickson et al. | 366/146 |
| 5,191,993 A | 3/1993 | Wanger et al. | 220/333 |
| 5,193,560 A | 3/1993 | Tanaka et al. | 134/56 R |
| 5,195,878 A | 3/1993 | Sahiavo et al. | 417/393 |
| 5,213,485 A | 5/1993 | Wilden | 417/393 |
| 5,213,619 A | 5/1993 | Jackson et al. | 134/1 |
| 5,215,592 A | 6/1993 | Jackson | 134/1 |
| 5,217,043 A | 6/1993 | Novakovi | 137/460 |
| 5,221,019 A | 6/1993 | Pechacek et al. | 220/315 |
| 5,222,876 A | 6/1993 | Budde | 417/393 |
| 5,224,504 A | 7/1993 | Thompson et al. | 134/155 |
| 5,236,602 A | 8/1993 | Jackson | 210/748 |
| 5,236,669 A | 8/1993 | Simmons et al. | 422/113 |
| 5,237,824 A | 8/1993 | Pawliszyn | 62/51.1 |
| 5,240,390 A | 8/1993 | Kvinge et al. | 417/393 |
| 5,243,821 A | 9/1993 | Schuck et al. | 62/50.6 |
| 5,246,500 A | 9/1993 | Samata et al. | 118/719 |
| 5,251,776 A | 10/1993 | Morgan, Jr. et al. | 220/360 |
| 5,267,455 A | 12/1993 | Dewees et al. | 68/5 C |
| 5,280,693 A | 1/1994 | Heudecker | 53/306 |
| 5,285,352 A | 2/1994 | Pastore et al. | 361/707 |
| 5,288,333 A | 2/1994 | Tanaka et al. | 134/31 |
| 5,304,515 A | 4/1994 | Morita et al. | 437/231 |
| 5,306,350 A | 4/1994 | Hoy et al. | 134/22.14 |
| 5,313,965 A | 5/1994 | Palen | 134/61 |
| 5,314,574 A | 5/1994 | Takahashi | 156/646 |
| 5,316,591 A | 5/1994 | Chao et al. | 134/34 |
| 5,328,722 A | 7/1994 | Ghanayem et al. | 427/250 |
| 5,337,446 A | 8/1994 | Smith et al. | 15/21.1 |
| 5,339,844 A | 8/1994 | Stanford, Jr. et al. | 134/107 |
| 5,355,901 A | 10/1994 | Mielnik et al. | 134/105 |
| 5,368,171 A | 11/1994 | Jackson | 134/147 |
| 5,370,740 A | 12/1994 | Chao et al. | 134/1 |
| 5,370,741 A | 12/1994 | Bergman | 134/3 |
| 5,377,705 A | 1/1995 | Smith, Jr. et al. | 134/95.3 |
| 5,401,322 A | 3/1995 | Marshall | 134/13 |
| 5,403,621 A | 4/1995 | Jackson et al. | 427/255.1 |
| 5,404,894 A | 4/1995 | Shiraiwa | 134/66 |
| 5,412,958 A | 5/1995 | Iliff et al. | 68/5 C |
| 5,417,768 A | 5/1995 | Smith, Jr. et al. | 134/10 |
| 5,433,334 A | 7/1995 | Reneau | 220/319 |
| 5,447,294 A | 9/1995 | Sakata et al. | 266/257 |
| 5,456,759 A | 10/1995 | Stanford, Jr. et al. | 134/1 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,503,176 A | 4/1996 | Dummire et al. | 137/15 |
| 5,505,219 A | 4/1996 | Lansberry et al. | 134/105 |
| 5,509,431 A | 4/1996 | Smith, Jr. et al. | 134/95.1 |
| 5,514,220 A | 5/1996 | Wetmore et al. | 134/22.18 |
| 5,522,938 A | 6/1996 | O'Brien | 134/1 |
| 5,526,834 A | 6/1996 | Mielnik et al. | 134/105 |
| 5,533,538 A | 7/1996 | Marshall | 134/104.4 |
| 5,547,774 A | 8/1996 | Gimzewski et al. | 428/694 |
| 5,550,211 A | 8/1996 | DeCrosta et al. | 528/489 |
| 5,571,330 A | 11/1996 | Kyogoku | 118/719 |
| 5,580,846 A | 12/1996 | Hayashida et al. | 510/175 |
| 5,589,082 A | 12/1996 | Lin et al. | 216/2 |
| 5,589,105 A | 12/1996 | DeSimone et al. | 252/351 |
| 5,589,224 A | 12/1996 | Tepman et al. | 427/248.1 |
| 5,618,751 A | 4/1997 | Golden et al. | 438/392 |
| 5,621,982 A | 4/1997 | Yamashita et al. | 34/203 |
| 5,629,918 A | 5/1997 | Ho et al. | 369/112 |
| 5,632,847 A | 5/1997 | Ohno et al. | 156/344 |
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,644,855 A | 7/1997 | McDermott et al. | 34/516 |
| 5,649,809 A | 7/1997 | Stapelfeldt | 417/63 |
| 5,656,097 A | 8/1997 | Olesen et al. | 134/1 |
| 5,665,527 A | 9/1997 | Allen et al. | 430/325 |
| 5,669,251 A | 9/1997 | Townsend et al. | 68/58 |
| 5,672,204 A | 9/1997 | Habuka | 117/204 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,702,228 A | 12/1997 | Tamai et al. | 414/744.5 |
| 5,706,319 A | 1/1998 | Holtz | 376/203 |
| 5,714,299 A | 2/1998 | Combes et al. | 430/137 |
| 5,725,987 A | 3/1998 | Combes et al. | 430/137 |
| 5,726,211 A | 3/1998 | Hedrick et al. | 521/61 |
| 5,730,874 A | 3/1998 | Wai et al. | 210/638 |
| 5,736,425 A | 4/1998 | Smith et al. | 438/778 |
| 5,739,223 A | 4/1998 | DeSimone | 526/89 |
| 5,746,008 A | 5/1998 | Yamashita et al. | 34/211 |
| 5,766,367 A | 6/1998 | Smith et al. | 134/2 |
| 5,769,588 A | 6/1998 | Toshima et al. | 414/217 |
| 5,783,082 A | 7/1998 | DeSimone et al. | 210/634 |
| 5,797,719 A | 8/1998 | James et al. | 417/46 |
| 5,798,126 A | 8/1998 | Fujikawa et al. | 425/78 |
| 5,798,438 A | 8/1998 | Sawan et al. | 528/483 |
| 5,804,607 A | 9/1998 | Hedrick et al. | 521/64 |
| 5,807,607 A | 9/1998 | Smith et al. | 427/96 |
| 5,817,178 A | 10/1998 | Mita et al. | 118/666 |
| 5,847,443 A | 12/1998 | Cho et al. | 257/632 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,061 A | 2/1999 | Lee et al. | 438/705 |
| 5,872,257 A | 2/1999 | Beckman et al. | 546/336 |

| Patent No. | Date | Inventor | Class |
|---|---|---|---|
| 5,873,948 A | 2/1999 | Kim | 134/19 |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | 417/46 |
| 5,893,756 A | 4/1999 | Berman et al. | 438/692 |
| 5,896,870 A | 4/1999 | Huynh et al. | 134/1.3 |
| 5,898,727 A | 4/1999 | Fujikawa et al. | 373/110 |
| 5,900,107 A | 5/1999 | Murphy et al. | 156/359 |
| 5,900,354 A | 5/1999 | Batchelder | 430/395 |
| 5,904,737 A | 5/1999 | Preston et al. | 8/158 |
| 5,906,866 A | 5/1999 | Webb | 427/534 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,934,856 A | 8/1999 | Asakawa et al. | 414/217 |
| 5,934,991 A | 8/1999 | Rush | 454/187 |
| 5,955,140 A | 9/1999 | Smith et al. | 427/96 |
| 5,975,492 A | 11/1999 | Brenes | 251/175 |
| 5,976,264 A | 11/1999 | McCullough et al. | 134/2 |
| 5,979,306 A | 11/1999 | Fujikawa et al. | 100/90 |
| 5,980,648 A | 11/1999 | Adler | 134/34 |
| 5,981,399 A | 11/1999 | Kawamura et al. | 438/715 |
| 5,989,342 A | 11/1999 | Ikede et al. | 118/52 |
| 6,005,226 A | 12/1999 | Aschner et al. | 219/390 |
| 6,017,820 A | 1/2000 | Ting et al. | 438/689 |
| 6,024,801 A | 2/2000 | Wallace et al. | 134/1 |
| 6,029,371 A | 2/2000 | Kamikawa et al. | 34/516 |
| 6,035,871 A | 3/2000 | Eui-Yeol | 134/61 |
| 6,037,277 A | 3/2000 | Masakara et al. | 438/787 |
| 6,053,348 A | 4/2000 | Morch | 220/263 |
| 6,056,008 A | 5/2000 | Adams et al. | 137/487.5 |
| 6,067,728 A | 5/2000 | Farmer et al. | 34/470 |
| 6,077,053 A | 6/2000 | Fujikawa et al. | 417/399 |
| 6,077,321 A | 6/2000 | Adachi et al. | 29/25.01 |
| 6,082,150 A | 7/2000 | Stucker | 68/18 R |
| 6,085,935 A | 7/2000 | Malchow et al. | 220/813 |
| 6,097,015 A | 8/2000 | McCullough et al. | 219/686 |
| 6,110,232 A | 8/2000 | Chen et al. | 29/25.01 |
| 6,122,566 A | 9/2000 | Nguyen et al. | 700/218 |
| 6,128,830 A | 10/2000 | Bettcher et al. | 34/404 |
| 6,145,519 A | 11/2000 | Konishi et al. | 134/95.2 |
| 6,149,828 A | 11/2000 | Vaartstra | 216/57 |
| 6,159,295 A | 12/2000 | Maskara et al. | 118/688 |
| 6,164,297 A | 12/2000 | Kamikawa | 134/61 |
| 6,180,533 B1 * | 1/2001 | Jain et al. | 438/714 |
| 6,186,722 B1 | 2/2001 | Shirai | 414/217 |
| 6,203,582 B1 | 3/2001 | Berner et al. | 29/25.01 |
| 6,216,364 B1 | 4/2001 | Tanaka et al. | 34/448 |
| 6,228,563 B1 | 5/2001 | Starov et al. | 430/327 |
| 6,235,634 B1 | 5/2001 | White et al. | 438/680 |
| 6,239,038 B1 | 5/2001 | Wen | 438/745 |
| 6,241,825 B1 | 6/2001 | Wytman | 118/733 |
| 6,242,165 B1 | 6/2001 | Vaartstra | 430/329 |
| 6,244,121 B1 | 6/2001 | Hunter | 73/865.9 |
| 6,251,250 B1 | 6/2001 | Keigler | 205/89 |
| 6,277,753 B1 | 8/2001 | Mullee et al. | 438/692 |
| 6,286,231 B1 | 9/2001 | Bergman et al. | 34/410 |
| 6,305,677 B1 | 10/2001 | Lenz | 269/13 |
| 6,306,564 B1 * | 10/2001 | Mullee | 430/329 |
| 6,319,858 B1 | 11/2001 | Lee et al. | 438/787 |
| 6,334,266 B1 | 1/2002 | Moritz et al. | 34/337 |
| 6,344,174 B1 | 2/2002 | Miller et al. | 422/98 |
| 6,355,072 B1 | 3/2002 | Racette et al. | 8/142 |
| 6,388,317 B1 | 5/2002 | Reese | 257/713 |
| 6,389,677 B1 | 5/2002 | Lenz | 29/559 |
| 6,418,956 B1 | 7/2002 | Bloom | 137/14 |
| 6,436,824 B1 | 8/2002 | Chooi et al. | 438/687 |
| 6,454,519 B1 | 9/2002 | Toshima et al. | 414/805 |
| 6,454,945 B1 | 9/2002 | Weigl et al. | 210/634 |
| 6,464,790 B1 | 10/2002 | Sherstinsky et al. | 118/715 |
| 6,478,035 B1 | 11/2002 | Niuya et al. | |
| 6,487,792 B2 | 12/2002 | Sutton et al. | |
| 6,487,994 B2 | 12/2002 | Ahern et al. | |
| 6,508,259 B1 | 1/2003 | Tseronis et al. | 134/105 |
| 6,520,767 B1 | 2/2003 | Ahern et al. | |
| 6,521,466 B1 | 2/2003 | Castrucci | 438/5 |
| 6,541,278 B2 | 4/2003 | Morita et al. | 438/3 |
| 6,546,946 B2 | 4/2003 | Dunmire | 137/15.18 |
| 6,550,484 B1 | 4/2003 | Gopinath et al. | 134/1.2 |
| 6,558,475 B1 | 5/2003 | Jur et al. | 134/21 |
| 6,561,213 B2 | 5/2003 | Wang et al. | 137/263 |
| 6,561,220 B2 | 5/2003 | McCullough et al. | 137/565.12 |
| 6,561,481 B1 | 5/2003 | Filonczuk | 251/129.12 |
| 6,561,767 B2 | 5/2003 | Berger et al. | 417/53 |
| 6,561,774 B2 | 5/2003 | Layman | |
| 6,596,093 B2 | 7/2003 | DeYoung et al. | 134/36 |
| 6,666,986 B1 * | 12/2003 | Vaartstra | 252/79.1 |
| 6,722,642 B1 | 4/2004 | Sutton et al. | |
| 6,736,149 B2 | 5/2004 | Biberger et al. | |
| 6,748,960 B1 | 6/2004 | Biberger et al. | |
| 6,852,194 B2 | 2/2005 | Matsushita et al. | |
| 6,871,656 B2 | 3/2005 | Mullee | |
| 6,890,853 B2 | 5/2005 | Biberger et al. | |
| 6,921,456 B2 | 7/2005 | Biberger et al. | |
| 6,924,086 B1 | 8/2005 | Arena-Foster et al. | |
| 6,926,012 B2 | 8/2005 | Biberger et al. | |
| 6,926,798 B2 | 8/2005 | Biberger et al. | 156/345.31 |
| 6,928,746 B2 | 8/2005 | Arena-Foster et al. | |
| 6,953,654 B2 | 10/2005 | Ryza et al. | |
| 2002/0001929 A1 | 1/2002 | Biberger et al. | 438/584 |
| 2003/0196679 A1 | 10/2003 | Cotte et al. | 134/1 |
| 2003/0198895 A1 | 10/2003 | Toma et al. | |
| 2003/0202792 A1 | 10/2003 | Goshi | |
| 2003/0205510 A1 | 11/2003 | Jackson | 210/86 |
| 2004/0011386 A1 | 1/2004 | Seghal | |
| 2004/0020518 A1 | 2/2004 | DeYoung et al. | 134/30 |
| 2004/0045588 A1 | 3/2004 | DeYoung et al. | 134/26 |
| 2004/0259357 A1 | 12/2004 | Saga | |
| 2004/0261710 A1 | 12/2004 | Matsushita et al. | |
| 2005/0026363 A1 * | 2/2005 | Cheng et al. | 438/257 |
| 2005/0077597 A1 | 4/2005 | Toma et al. | |
| 2005/0158477 A1 | 7/2005 | Vezin et al. | |
| 2005/0203789 A1 | 9/2005 | Kauffman et al. | |
| 2005/0215072 A1 | 9/2005 | Kevwitch et al. | |
| 2005/0216228 A1 | 9/2005 | Kauffman et al. | |
| 2006/0003592 A1 | 1/2006 | Gale et al. | |

FOREIGN PATENT DOCUMENTS

| | | |
|---|---|---|
| CN | 1399790 A | 2/2003 |
| DE | 36 08 783 A1 | 9/1987 |
| DE | 39 04 514 C2 | 3/1990 |
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| DE | 198 60 084 A1 | 7/2000 |
| EP | 0 244 951 A2 | 11/1987 |
| EP | 0 272 141 A2 | 6/1988 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 587 168 A1 | 3/1994 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |

| | | |
|---|---|---|
| EP | 0 829 312 A2 | 3/1998 |
| EP | 0 836 895 A2 | 4/1998 |
| EP | 0 903 775 A2 | 3/1999 |
| FR | 1 499 491 | 9/1967 |
| GB | 2 003 975 | 3/1979 |
| GB | 2 193 482 | 2/1988 |
| JP | 60-192333 | 9/1985 |
| JP | 60-2348479 | 11/1985 |
| JP | 60-246635 | 12/1985 |
| JP | 61-017151 | 1/1986 |
| JP | 61-231166 | 10/1986 |
| JP | 62-111442 | 5/1987 |
| JP | 62-125619 | 6/1987 |
| JP | 63-256326 | 10/1988 |
| JP | 63-303059 | 12/1988 |
| JP | 1-045131 | 2/1989 |
| JP | 1-246835 | 10/1989 |
| JP | 2-148841 | 6/1990 |
| JP | 2-209729 | 8/1990 |
| JP | 2-304941 | 12/1990 |
| JP | 4-284648 | 10/1992 |
| JP | 7-142333 | 6/1995 |
| JP | 8-186140 A | 7/1996 |
| JP | 8-222508 A | 8/1996 |
| JP | 10-144757 A | 5/1998 |
| JP | 56-142629 | 11/1998 |
| JP | 10335408 A | 12/1998 |
| JP | 11-200035 | 7/1999 |
| JP | 2000-106358 | 4/2000 |
| WO | WO 87/07309 | 12/1987 |
| WO | WO 90/06189 | 6/1990 |
| WO | WO 90/13675 | 11/1990 |
| WO | WO 91/12629 A | 8/1991 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/18603 A | 4/1999 |
| WO | WO 99/49998 | 10/1999 |
| WO | WO 00/36635 | 6/2000 |
| WO | WO 00/73241 A1 | 12/2000 |
| WO | WO 01/10733 A1 | 2/2001 |
| WO | WO 01/33613 A2 | 5/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A2 | 12/2001 |
| WO | WO 02/09894 A2 | 2/2002 |
| WO | WO 02/11191 A2 | 2/2002 |
| WO | WO 02/15251 A1 | 2/2002 |
| WO | WO 02/16051 A2 | 2/2002 |
| WO | WO03064065 A1 | 8/2003 |
| WO | WO 03/030219 A2 | 10/2003 |

OTHER PUBLICATIONS

Los Alamos National Laboratory, Solid State Technology, pp. S10 & S14, Oct. 1998.
Supercritical Carbon Dioxide Resist Remover, SCORR, the Path to Least Photoresistance, Los Almaos National Laboratory, 1998.
Z. Guan et al., Fluorocarbon-Based Heterophase Polymeric Materials. I. Block Copolymer Surfactants for Carbon Dioxide Applications, Macromolecules, vol. 27, pp. 5527-5532, 1994.
International Journal of Environmentally Conscious Design & Manufacturing, vol. 2, No. 1, pp. 83, 1993.
Matson and Smith , Supercritical Fluids, Journal of the American Ceramic Society, vol. 72, No. 6, pp. 872-874.
D. H. Ziger et al., Compressed Fluid Technology: Application to RIE Developed Resists, AIChE Journal vol. 33, No. 10, pp. 1585-1591, Oct. 1987.
Kirk-Othmer, Alcohol Fuels to Toxicology, Encyclopedia of Chemical Terminology, 3rd ed., Supplement Volume, New York: John Wiley & Sons, pp. 872-893, 1984.
Cleaning with Supercritical $CO_2$2, NASA Tech Briefs, MFS-29611, Marshall Space Flight Center, Alabama, Mar. 1979.
N. Basta, Supercritical Fluids: Still Seeking Acceptance, Chemical Engineering vol. 92, No. 3, pp. 14, Feb. 24, 1985.
D. Takahashi, Los Alamos Lab Finds Way to Cut Chip Toxic Waste, Wall Street Journal, Jun. 22, 1998.
Supercritical $CO_2$ Process Offers Less Mess from Semiconductor Plants, Chemical Engineering Magazine, pp. 27 & 29, Jul. 1988.
Y. P. Sun, Preparation of Polymer Protected Semiconductor Nanoparticles Through the Rapid Expansion of Supercritical Fluid Solution, Chemical Physics Letters, pp. 585-588, May 22, 1998.
K. Jackson et al., Surfactants and Micromulsions in Supercirtical Fluids, Supercritical Fluid Cleaning, Noyes Publications, Westwood, NJ, pp. 87-120, Spring 1998.
M. Kryszcwski, Production of Metal and Semiconductor Nanoparticles in Polymer Systems, Polimery, pp. 65-73, Feb. 1998.
G. L. Bakker et al., Surface Cleaning and Carbonaceous Film Removal Using High Pressure, High Temperature Water, and Water/ $CO_2$ Mixtures, J Electrochem Soc., vol. 145, No. 1, pp. 284-291, Jan. 1998.
C. K. Ober et al., Imaging Polymers with Supercritical Carbon Dioxide, Advanced Materials, vol. 9, No. 13, pp. 1039-1043, Nov. 3, 1997.
E. M. Russick et al., Supercritical Carbon Dioxide Extraction of Solvent from Micro-Machined Structures, Supercritical Fluids Extraction and Pollution Prevention, ACS Symposium Series, vol. 670, pp. 255-269, Oct. 21, 1997.
N. Dahmen et al., Supercritical Fluid Extraction of Grinding and Metal Cutting Waste Contaminated with Oils, Supercritical Fluids—Extraction and Pollution Prevention, ACS Symposium Series, vol. 670, pp. 270-279, Oct. 21, 1997.
C. M. Wal, Supercritical Fluid Extraction: Metals as Complexes, Journal of Chromatography A, vol. 785, pp. 369-383, Oct. 17, 1997.
C. Xu et al., Submicron-Sized Spherical Yttrium Oxide Based Phosphors Prepared by Supercritical $CO_2$-Assisted Nerosolization and Pyrolysis, Appl. Phys. Lett., vol. 71, No. 22, pp. 1643-1645, Sep. 22, 1997.
Y. Tomioka et al., Decomposition of Tetramethylammonium (TMA) in a Positive Photo-resist Developer by Supercritical Water, Abstracts of Papers 214th ACS Natl Meeting, American Chemical Society, Abstract No. 108, Sep. 7, 1997.
H. Klein et al., Cyclic Organic Carbonates Serve as Solvents and Reactive Diluents, Coatings World, pp. 38-40, May 1997.
J. Bühler et al., Linear Array of Complementary Metal Oxide Semiconductor Double-Pass Metal Micro-mirrors, Opt. Eng. vol. 36, No. 5, pp. 1391-1398, May 1997.
M. H. Jo et al., Evaluation of $SiO_2$ Aerogel Thin Film with Ultra Low Dielectric Constant as an Intermetal Dielectric, Micrelectronic Engineering, vol. 33, pp. 343-348, Jan. 1997.
J. B. McClain et al., Design of Nonionic Surfactants for Supercritical Carbon Dioxide, Science, vol. 274, pp. 2049-2052, Dec. 20, 1996.
L. Znaidi et al., Batch and Semi-Continuous Synthesis of Magnesium Oxide Powders from Hydrolysis and Supercritical Treatment of $Mg(OCH_3)_2$, Materials Research Bulletin, vol. 31, No. 12, pp. 1527-1535, Dec. 1996.
M. E. Tadros, Synthesis of Titanium Dioxide Particles in Supercritical $CO_2$, J. Supercritical Fluids, vol. 9, pp. 172-176, Sep. 1996.
V. G. Courtecuisse et al., Kinetics of the Titanium Isopropoxide Decomposition in Supercritical Isopropyl Alcohol, Ind. Eng. Chem. Res., vol. 35, No. 8, pp. 2539-2545, Aug. 1996.
A. Gabor et al., Block and Random Copolymer Resists Designed for 193 nm Lithography and Environmentally Friendly Supercritical $CO_2$Development, SPIE, vol. 2724, pp. 410-417, Jun. 1996.
G. L. Schimek et al., Supercritical Ammonia Synthesis and Characterization of Four New Alkali Metal Silver Antimony Sulfides . . ., J. Solid State Chemistry, vol. 123, pp. 277-284, May 1996.
P. Gallagher-Wetmore et al. Supercritical Fluid Processing: Opportunities for New Resist Materials and Processes, SPIE, vol. 2725, pp. 289-299, Apr. 1996.

K. I. Papathomas et al., Debonding of Photoresists by Organic Solvents, J. Applied Polymer Science, vol. 59, pp. 2029-2037, Mar. 28, 1996.

J. J. Watkins et al., Polymer/Metal Nanocomposite Synthesis in Supercritical $CO_2$, Chemistry of Materials, vol. 7, No. 11, pp. 1991-1994, Nov. 1995.

E. F. Gloyna et al., Supercritical Water Oxidation Research and Development Update, Environmental Progress, vol. 14, No. 3, pp. 182-192, Aug. 1995.

P. Gallagher-Wetmore et al., Supercritical Fluid Processing: A New Dry Technique for Photoresist Developing, SPIE, vol. 2438, pp. 694-708, Jun. 1995.

A. H. Gabor et al., Silicon-Containing Block Copolymer Resist Material, Microelectronics Technology—Polymers for Advanced Imaging and Packaging, ACS Symposium Series, vol. 615, pp. 281-298, Apr. 1995.

P. C. Tsiartas et al., Effect of Molecular Weight Distribution on the Dissolution Properties of Novolac Blends, SPIE, vol. 2438, pp. 264-271, Jun. 1995.

R. D. Allen et al., Performance Properties of Near-Monodisperse Novolak Resins, SPIE, vol. 2438, pp. 250-260, Jun. 1995.

P. T. Wood et al., Synthesis of New Channeled Structures in Supercritical Amines . . . , Inorg. Chem., vol. 33, pp. 1556-1558, 1994.

J. B. Jerome et al., Synthesis of New Low-Dimensional Quaternary Compounds . . . , Inorg. Chem., vol. 33, pp. 1733-1734, 1994.

J. McHardy et al., Progress in Supercritical $CO_2$ Cleaning, SAMPE Jour, vol. 29, No. 5, pp. 20-27, Sep. 1993.

R. Purtell et al., Precision Parts Cleaning Using Supercritical Fluids, J. Vac. Sci. Technol. A., vol. 11, No. 4, pp. 1696-1701, Jul. 1993.

E. Bok et al., Supercritical Fluids for Single Wafer Cleaning, Solid State Technology, pp. 117-120, Jun. 1992.

T. Adschiri et al., Rapid and Continuous Hydrothermal Crystallization of Metal Oxide Particles in Supercritical Water, J. Am. Ceram. Cos., vol. 75, No. 4, 1019-1022, 1992.

B. N. Hansen et al., Supercritical Fluid Transport—Chemical Deposition of Films, Chem. Mater, vol. 4, No. 4, pp. 749-752, 1992.

S. H. Page et al., Predictability and Effect of Phase Behavior of $CO_2$/Propylene Carbonate in Supercritical Fluid Chromatography, J. Microcol, vol. 3, No. 4, pp. 355-369, 1991.

T. Brokamp et al., Synthese und Kristallstruktur Eines Gemischtvalenten Lithium-Tantainitrid $Li_2Ta_3N_5$, J. Alloys and Compounds, vol. 176, pp. 47-60, 1991.

B. M. Hybertson et al., Deposition of Palladium Films by a Novel Supercritical Transport Chemical Deposition Process, Mat. Res. Bull., vol. 26, pp. 1127-1133, 1991.

D. W. Matson et al., Rapid Expansion of Supercritical Fluid Solutions: Solute Formation Powders, Thin Films, and Fibers, Ind. Eng. Chem. Res., vol. 26, No. 11, pp. 2298-2306, 1987.

W. K. Tolley et al., Stripping Organics from Metal and Mineral Surfaces Using Supercritical Fluids, Separation Science and Technology, vol. 22. pp. 1087-1101, 1987.

Final Report on the Safety Assessment of Propylene Carbonate, J. American College of Toxicology, vol. 6, No. 1, pp. 23-51, 1987.

Porous Xerogel Films as Ultra-Low Permittivity Dielectrics for ULSI Interconnect Applications, Materials Research Society, pp. 463-469, 1987.

Kawakami et al., A Super Low-k(k=1.1) Silica Aerogel Film Using Supercritical Drying Technique, IEEE, pp. 143-145, 2000.

R. F. Reidy, Effects of Supercritical Processing on Ultra Low-k Films, Texas Advanced Technology Program, Texas Instruments and the Texas Academy of Mathematics and Science.

Anthony Muscat, Backend Processing Using Supercritical $CO_2$, University of Arizona.

D. Goldfarb et al., Aqueous-based Photoresist Drying Using Supercritical Carbon Dioxide to Prevent Pattern Collapse, J. Vacuum Sci. Tech. B, vol. 18, No. 6, pp. 3313, 2000.

H. Namatsu et al., Supercritical Drying for Water-Rinsed Resist Systems, J. Vacuum Sci. Tech. B, vol. 18, No. 6, pp. 3308, 2000.

N. Sundararajan et al., Supercritical $CO_2$ Processing for Submicron imaging of Fluoropolymers, Chem. Mater., vol. 12, 41, 2000.

Hideaki Itakura et al., Multi-Chamber Dry Etching System, Solid State Technology, pp. 209-214, Apr. 1982.

Joseph L. Foszez, Diaphragm Pumps Eliminate Seal Problems, Plant Engineering, pp. 1-5, Feb. 1, 1996.

Bob Agnew, Wilden Air-Operated Diaphragm Pumps, Process & Industrial Training Technologies, Inc. 1996.

Jones et al., HF Etchant Solutions in Supercritical Carbon Dioxide for "Dry" Etch Processing of Microelectronic Devices, Chem Mater., vol. 15, 2003, 2867-2869.

Gangopadhyay et al., Supercritical $CO_2$ Treatments for Semiconductor Applications, Mat. Res. Symp. Proc., vol. 812, 2004, pp. F4.6.1-F4.6.6.

European Patent Office, *International Search Report*, PCT/US2005/013885, Oct. 24, 2005, 4 pp.

* cited by examiner

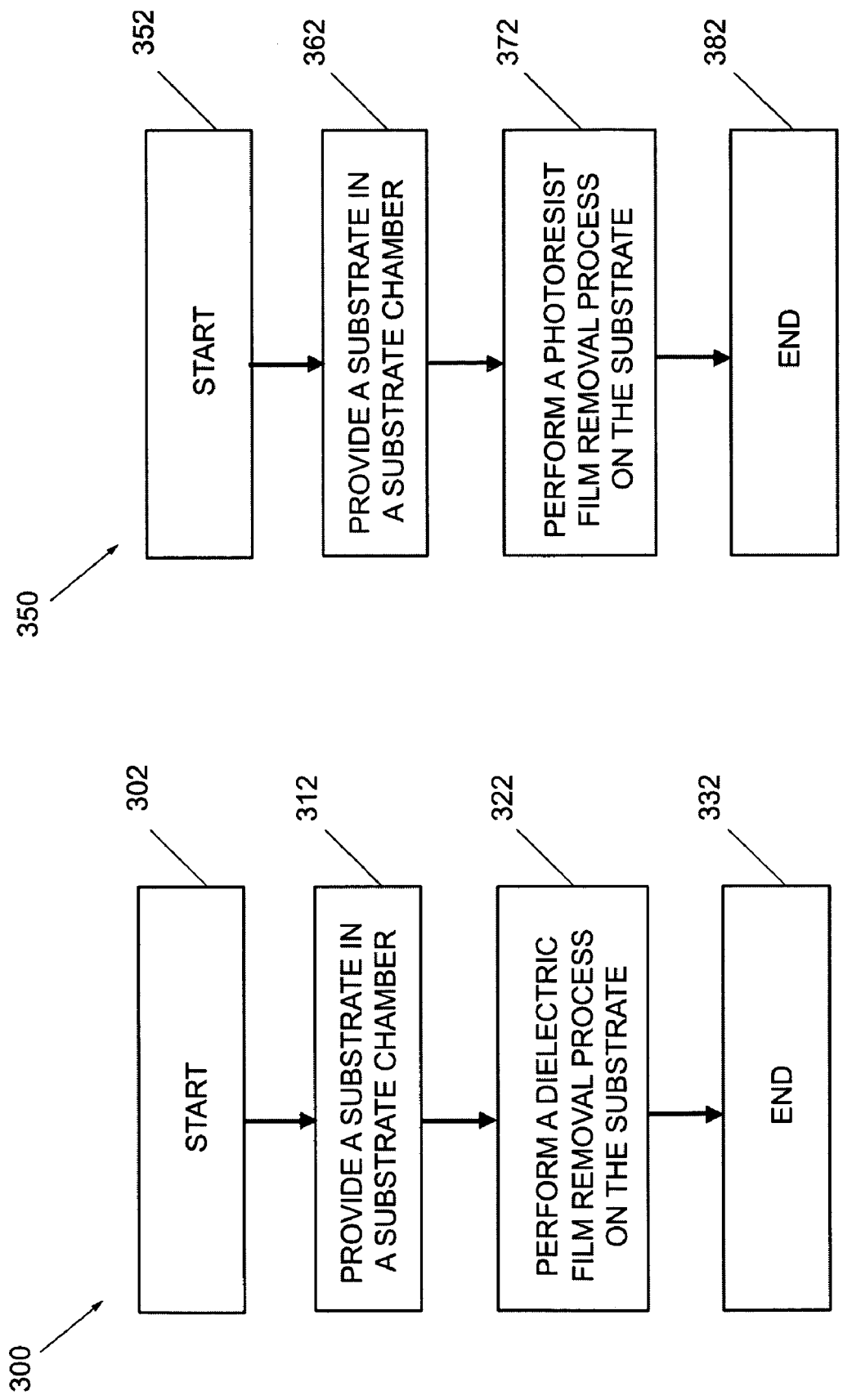

SYSTEM AND METHOD FOR PROCESSING A SUBSTRATE USING SUPERCRITICAL CARBON DIOXIDE PROCESSING

FIELD OF THE INVENTION

The invention relates to semiconductor manufacturing, and more particularly, to utilizing supercritical $CO_2$ processing to remove a film from a micro-feature on a substrate.

BACKGROUND OF THE INVENTION

In the semiconductor industry, the minimum feature sizes of microelectronic devices are approaching the deep submicron regime to meet the demand for faster, lower power microprocessors and digital circuits. In the manufacturing of a trench capacitor for a dynamic random access memory (DRAM) device, a deep trench (DT) is etched several microns ($\mu$m) into a silicon substrate. During manufacturing of a deep trench capacitor, a dielectric film, such as doped silicon dioxide film (e.g., arsenic-doped silicon dioxide, also referred to as arsenosilicate glass (ASG)), is deposited on the sidewalls of the trench, in order to provide out-diffusion of the dopant (e.g., arsenic, As) from the doped dielectric film into the sidewalls of the silicon trench to form one plate of the capacitor.

In current trench capacitor technology, the width of the trench can be about 0.2 microns, or less, and the trench depth to diameter aspect ratio can be as great as about 50:1, or even greater. Due to these aggressive trench dimensions, it can be difficult to process films located in the trench. In addition to utilizing a trench with straight vertical sidewalls, current trench capacitor technology may use a "bottle-shaped" trench, in which the bottom portion of the trench is etched to be wider than the top portion of the trench, in order to increase the capacitor surface area. This presents further difficulties for processing films located in the trench.

SUMMARY OF THE INVENTION

A system and method are provided for removing a dielectric film and a photoresist film from a micro-feature on a substrate. A method is provided for processing a substrate having a micro-feature containing a dielectric film on the sidewalls of the micro-feature and a photoresist film covering a portion of the dielectric film, and performing a first film removal process on the substrate using supercritical $CO_2$ processing, wherein the portion of the dielectric film not covered by the photoresist film is removed.

In one embodiment of the invention, the method further contains a second film removal process that can be performed on the substrate using supercritical $CO_2$ processing to remove the photoresist film, wherein the second film removal process is performed following the first film removal process.

In another embodiment of the invention, the second film removal process can be performed on the substrate using wet processing to remove the photoresist film, wherein the second film removal process is performed following the first film removal process.

In yet another embodiment of the invention, a method is provided for processing a substrate having a micro-feature containing a dielectric film on the sidewalls of the micro-feature and a photoresist film covering a portion of the dielectric film, performing a first film removal process on the substrate using wet processing, wherein the portion of the dielectric film not covered by the photoresist film is removed, and performing a second film removal process on the substrate using supercritical $CO_2$ processing to remove the photoresist film, wherein the second film removal process is performed following the first film removal process.

A film removal system is provided for processing a substrate, the system including a substrate transfer system configured for transferring the substrate within the film removal system, a substrate chamber configured for performing a supercritical $CO_2$ film removal process on a substrate having a micro-feature containing a dielectric film and a photoresist film covering a portion of the dielectric film, wherein the supercritical $CO_2$ film removal process includes at least one of a first film removal process to remove the dielectric film not covered by the photoresist film and a second film removal process to remove the photoresist film following the first film removal process, a $CO_2$ supply system configured for pressurizing the substrate chamber with supercritical $CO_2$ fluid, a solvent supply system configured for delivering a solvent to the substrate chamber, and a controller configured for controlling the film removal system.

BRIEF DESCRIPTION OF THE DRAWINGS

In the drawings:

FIG. 3A is a flow diagram showing a simplified sequence of a dielectric film removal process according to an embodiment of the invention;

FIG. 3B is a flow diagram showing a simplified sequence of a photoresist film removal process according to another embodiment of the invention.

DETAILED DESCRIPTION OF SEVERAL EMBODIMENTS OF THE INVENTION

Figure 1A:
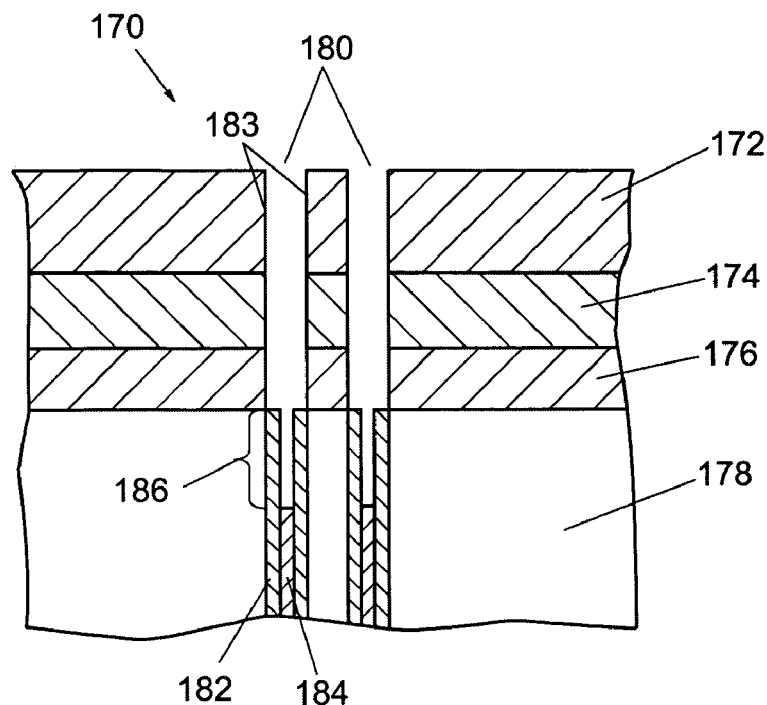
FIG. 1A schematically shows a cross-sectional view of a micro-feature containing a trench having a dielectric film and a photoresist film covering a portion of the dielectric film according to an embodiment of the invention.

The term micro-feature, as used herein, refers to a feature formed in a substrate and/or in a layer or layers formed on a substrate that has dimensions on the micrometer scale, and typically the sub-micron scale, i.e., less than 1 $\mu$m. FIG. 1A schematically shows a cross-sectional view of a micro-feature containing a trench having a dielectric film on the sidewalls of the trench and a photoresist film covering a portion of the dielectric film according to an embodiment of the invention. The micro-feature 170 contains a hard mask film 172 (e.g., borosilicate glass, BSG), a pad nitride film 174, a pad oxide film 176, and a silicon substrate 178. The micro-feature 170 further contains a trench 180 that is formed by etching through the films 172-176 and into the silicon substrate 178.

The trench 180 can be formed using a photolithographic process and dry etching techniques that are well known to persons skilled in the art of lithography and plasma etching. The exemplary trench 180 may have a width of about 0.2 micron, or less, and the trench aspect ratio may be 50:1, or even greater. In FIG. 1A, the part of the trench 180 etched in the silicon substrate 178 contains a dielectric film 182 on the sidewalls 183 and a photoresist film 184 covering the dielectric film 182 except for portion 186 of the dielectric film 182. The dielectric film 182 can, for example, be an arsenic-doped silicon dioxide film.

Methods for depositing the dielectric film 182 and the photoresist film 184 are well known to persons skilled in the art. For example, the photoresist film 184 can be formed by spin-coating a photoresist solution into the trench 180 and subsequently baking the photoresist solution. Then, an oxygen plasma may be used to recess the photoresist film 184 to the level where the dielectric film should terminate in the trench. Next, the portion 186 of the dielectric film 182 is removed from the trench 180.

Following removal of the exposed dielectric film 182 from the trench 180, the photoresist film 184 is removed from the trench 180. Removal of the photoresist film 184 must be performed without significantly affecting other materials in the micro-feature 170, including the pad oxide 176, the pad nitride 174, the hard mask 172, the remaining dielectric film 182, and silicon on the trench sidewalls 183.

An embodiment of the invention provides a method for selectively removing films from a micro-feature using supercritical carbon dioxide ($CO_2$) processing. $CO_2$ fluid is in a supercritical state when above the critical temperature $T_c$ of about 31° C. and above the critical pressure $P_c$ of about 1,070 pounds per square inch gauge (psig). Supercritical $CO_2$ fluid has virtually no viscosity or surface tension and has therefore no difficulty in penetrating all the way to the bottom of a deep trench or a hole and removing a film from the trench or the hole. Furthermore, supercritical $CO_2$ processing can avoid or reduce the use of hazardous and environmentally damaging wet chemicals that are frequently used at very high temperatures.

An additional benefit of supercritical $CO_2$ processing is the elimination of large volumes of water associated with the traditional wet processing, and the absence of sulfur residues that can result from inadequate rinsing during wet processing. Yet another benefit of supercritical $CO_2$ processing is the absence of watermarks that are frequently associated with wet processing in a trench, since no water or materials dissolved in the water need to be removed from the trenches. Furthermore, when processing a micro-feature, performing at least one film removal process using supercritical $CO_2$ processing can reduce overall processing time when compared to conventional wet processing.

Figure 1B:
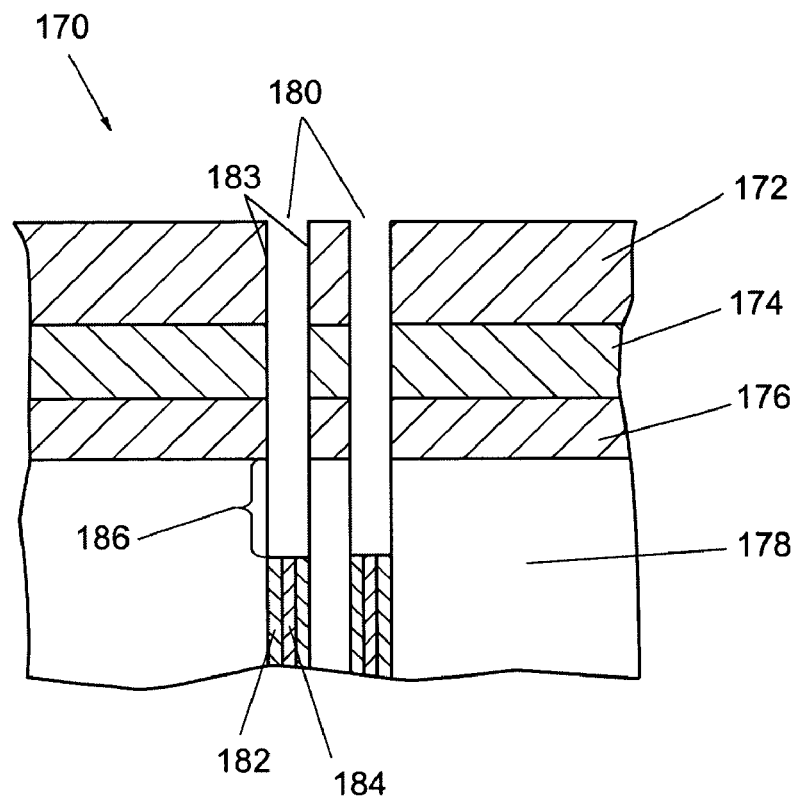
FIG. 1B schematically shows a cross-sectional view of the micro-feature in FIG. 1A following removal of the portion of the dielectric film not covered by the photoresist film according to an embodiment of the invention.

FIG. 1B schematically shows a cross-sectional view of the micro-feature 170 in FIG. 1A following removal of the portion 186 of the dielectric film 182 not covered by the photoresist film 184 according to an embodiment of the invention. According to one embodiment of the invention, the portion 186 of the dielectric film 182 may be selectively removed from the trench 180 by exposing the micro-feature 170 to supercritical $CO_2$ fluid and a first solvent dissolved in the supercritical $CO_2$ fluid. The first solvent dissolved in the supercritical $CO_2$ is capable of breaking down/dissolving the exposed dielectric film 182 without significantly affecting the photoresist film 184 and other materials in the micro-feature 170. The first solvent can, for example, contain $HF_{(aq)}$ or HF:pyridine. The micro-feature 170 is kept in contact with the supercritical $CO_2$ and the first solvent until the portion 186 of the dielectric film 180 has been broken down/dissolved and removed from the micro-feature 170 with the supercritical $CO_2$ fluid.

Figure 1C:
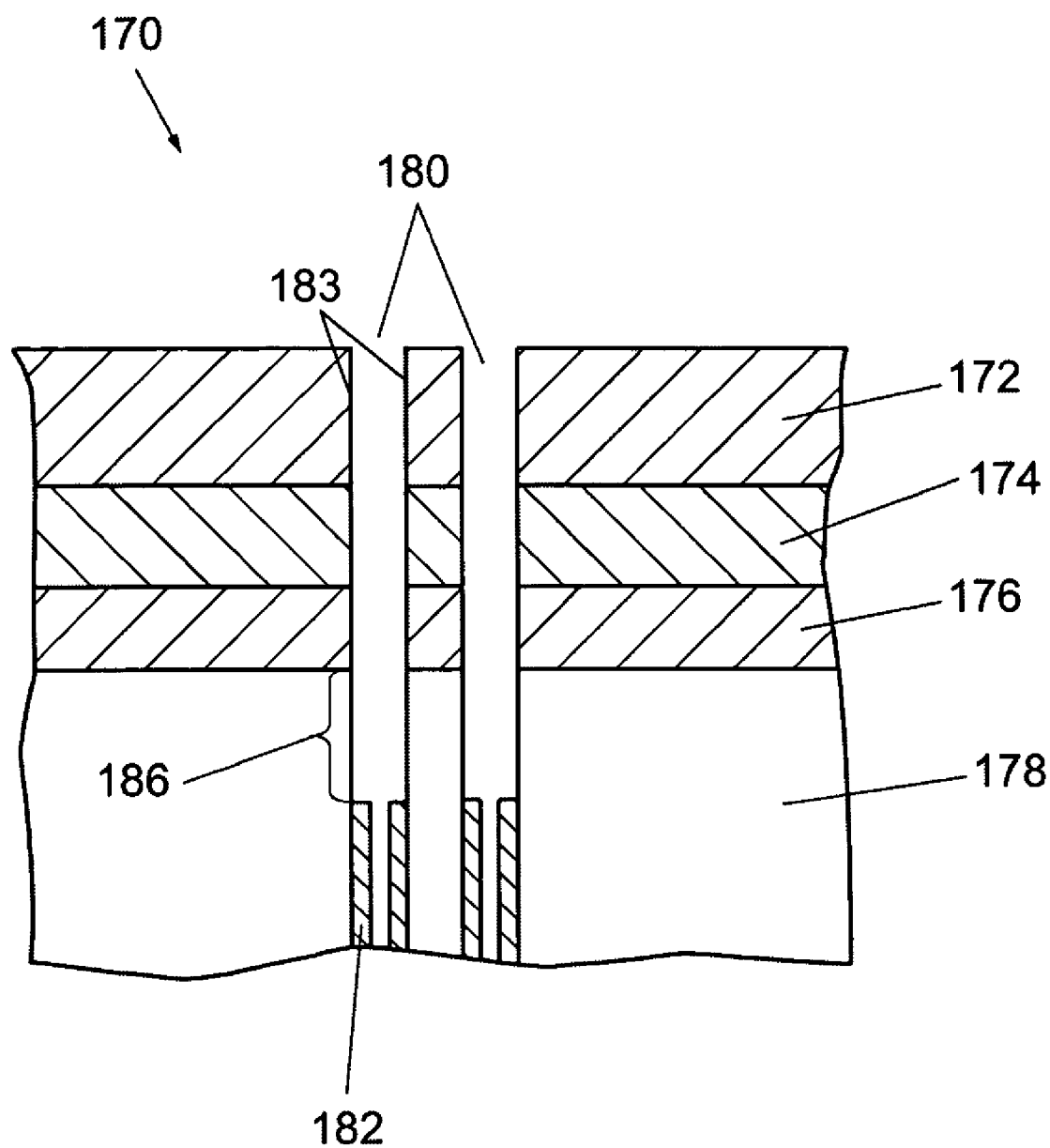
FIG. 1C schematically shows a cross-sectional view of the micro-feature in FIG. 1B following removal of the photoresist film according to an embodiment of the invention.

FIG. 1C schematically shows a cross-sectional view of the micro-feature in FIG. 1B following removal of the photoresist film 184 according to an embodiment of the invention. In one embodiment of the invention, the photoresist film 184 may be exposed to supercritical $CO_2$ fluid and a second solvent dissolved in the supercritical $CO_2$ fluid to selectively remove the photoresist film 184 from the trench 180. The second solvent dissolved in the supercritical $CO_2$ is capable of breaking down/dissolving the photoresist film 184 without significantly affecting other materials in the micro-feature 170. The second solvent can, for example, include N-methyl pyrrolidone, diisopropyl amine, triisopropyl amine, or diglycol amine, or a combination of two or more thereof.

In addition, the second solvent can, for example, further contain one of the following chemicals: methanol, ethanol, isopropyl alcohol, benzyl alcohol, acetone, butylene carbonate, propylene carbonate, dimethylsulfoxide, γ-butyrolactone, dimethyl formamide, dimethyl acetamide, ethyl lactate, hydrogen peroxide, benzoyl peroxide, oxygen, ozone, nitric acid, acetic acid, or formic acid, or a combination of two or more thereof. As persons skilled in the art will appreciate, the invention is not limited to these solvents and chemicals, as many other solvents and chemicals may be used to carry out an embodiment of the invention for removing the photoresist film 184 from the trench 180. The micro-feature 170 is kept in contact with the mixture of supercritical $CO_2$ and the second solvent, until the photoresist film 184 has been broken down/dissolved and removed from the micro-feature 170 with the supercritical $CO_2$ fluid.

According to an embodiment of the invention, both (a) the portion 186 of the dielectric film 182, and subsequently, (b) the photoresist film 184 may be removed from the trench 180 by supercritical $CO_2$ processing.

According to another embodiment of the invention, supercritical $CO_2$ processing can be performed in series with wet processing to remove the portion 186 of the dielectric film 182 and the photoresist film 184. In other words, the portion 186 of the dielectric film 182 can be removed by supercritical $CO_2$ processing, and the photoresist film 184 can be removed by wet processing, or alternately, the portion 186 of the dielectric film 182 can be removed by wet processing, and the photoresist film 184 may be removed by supercritical $CO_2$ processing. Wet processing of the dielectric film 182 can, for example, utilize an acid bath such as aqueous hydrofluoric acid ($HF_{(aq)}$), HF:pyridine, or $HF/NH_4F$. Wet processing of the photoresist film 184 may, for example, utilize an aqueous mixture of sulfuric acid and hydrogen peroxide (SPM) that is heated to approximately 120° C., or higher, $HF/HNO_3$, or $H_2O/O_3$.

Obviously, embodiments of the invention are not limited to micro-features having a trench, as micro-features having other geometries, for examples holes or other complex geometries, can be processed according to embodiments of the invention.

Figure 2A:
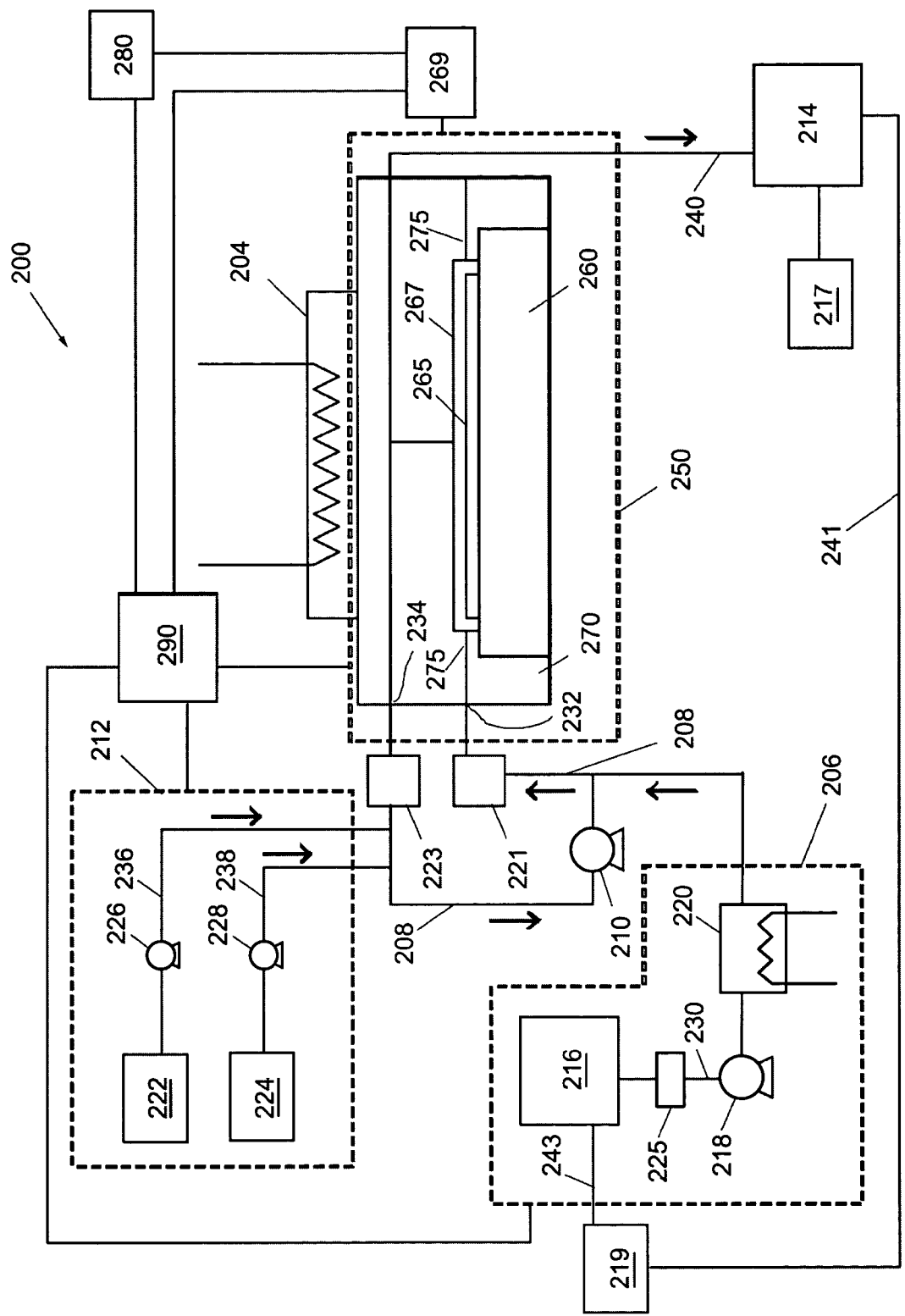
FIG. 2A is a schematic diagram showing a film removal system according to an embodiment of the invention.

FIG. 2A is a schematic diagram showing a film removal system according to an embodiment of the invention. The film removal system 200 in FIG. 2A includes a substrate chamber 250, a chamber heater 204 coupled to the substrate chamber 250, a $CO_2$ supply system 206, a circulation loop 208, a circulation pump 210, a solvent supply system 212, a separating vessel 214, a liquid/solid waste collection vessel 217, and a liquifying/purifying system 219. Substrate 265 is transferred within the film removal system 200 using a (robotic) substrate transfer system 269. The substrate 265 can be of any size, for example a 200 mm substrate, a 300 mm substrate, or an even larger substrate.

The substrate chamber 250 includes chamber housing 270, substrate holder 260, and processing zone 267 for processing the substrate 265. The substrate chamber 250 further includes injection nozzles 275 for introducing the supercritical $CO_2$ fluid into the processing zone 267. During the supercritical $CO_2$ processing, the substrate 265 is present in the processing zone 267, where a supercritical $CO_2$ fluid is used in conjunction with a solvent to remove a film from a micro-feature on the substrate 265. The process chamber heater 204 heats the substrate chamber 250 and may be a heating blanket.

The $CO_2$ supply system 206 includes a $CO_2$ supply vessel 216, a particle filter 225, a $CO_2$ pump 218, and a $CO_2$ heater 220. The solvent supply system 212 includes chemical solvent vessels 222 and 224, and first and second high pressure injection pumps 226 and 228.

The $CO_2$ supply vessel 216 is coupled to the circulation loop 208 via the $CO_2$ piping 230. The $CO_2$ piping 230 includes the heater 220 located between the $CO_2$ pump 218 and the circulation loop 208. The circulation pump 210 is located on the circulation loop 208, and the circulation loop 208 couples to the substrate chamber 250 at a circulation inlet 232 and at a circulation outlet 234. The solvent supply vessels 222 and 224 are coupled to the circulation loop 208 via solvent supply lines 236 and 238, respectively.

The separating vessel 214 is coupled to the process chamber 250 via exhaust gas piping 240. The liquid/solid waste collection vessel 217 is coupled to the separating vessel 214. The separating vessel 214 is also coupled to the liquifying/purifying system 219 via return gas piping 241. The liquifying/purifying system 219 is coupled to the $CO_2$ supply vessel 216 via liquid $CO_2$ piping 243. Alternatively, an off-site location houses the liquifying/purifying system 219, which receives exhaust gas in gas collection vessels and returns liquid $CO_2$ in liquid $CO_2$ vessels.

The first and second filters, 221 and 223, are coupled to the circulation loop 208. The first filter 221 can be a fine filter that is, for example, configured to filter 0.05 μm particles and larger particles from the cleaning fluid prior to its reaching the circulation inlet 232 to the process chamber 250. The second filter 223 can be a coarse filter that is, for example, configured to filter 2-3 μm particles and larger particles from the cleaning fluid after it leaves the process chamber 250 via circulation outlet 234. The third filter 225 couples the $CO_2$ supply vessel 216 to the $CO_2$ pump 218. The third filter 225 can, for example, be configured to filter 0.05 μm particles and larger particles from the $CO_2$ liquid prior to it reaching the circulation loop 208.

A controller 290 is coupled to and exchanges information with multiple components of the film removal system 200, including the substrate chamber 250, the $CO_2$ supply system 206, the solvent supply system 212, and the substrate transfer system 269. In addition, controller 290 is coupled to and exchanges information with valves, pumps, pressure gauges, heaters, and temperature gauges of the film removal system 200. The controller 290 is capable of generating control signals sufficient to communicate and control the inputs of the film removal system 200 as well as monitor the outputs from the film removal system 200.

It will be readily apparent to one skilled in the art that the film removal system 200 further includes valves, control electronics, and utility hookups which are typical of supercritical fluid processing systems. Further, it will be readily apparent to one skilled in the art that the injection nozzles 275 can be configured as part of the substrate holder 260 rather than as part of the chamber housing 270.

The film removal system 200 in FIG. 2A further contains a wet processing system 280 that is disposed in the film removal system 200. The wet processing system 280 is coupled to and exchanges information with the controller 290 and the substrate transfer system 269. According to an embodiment of the invention, supercritical $CO_2$ processing can be performed in series with wet processing to remove films from a micro-feature on the substrate 265. For example, as described in FIGS. 1A-1C, the portion 186 of the dielectric film 182 can be removed by supercritical $CO_2$ processing, and the photoresist film 184 can be removed by wet processing, or alternately, the portion 186 of the dielectric film 182 can be removed by wet processing, and the photoresist film 184 can be removed by supercritical $CO_2$ processing. The wet processing system 280 can be a conventional wet processing system that is well known to artisans skilled in the art of wet processing.

Figure 2B:
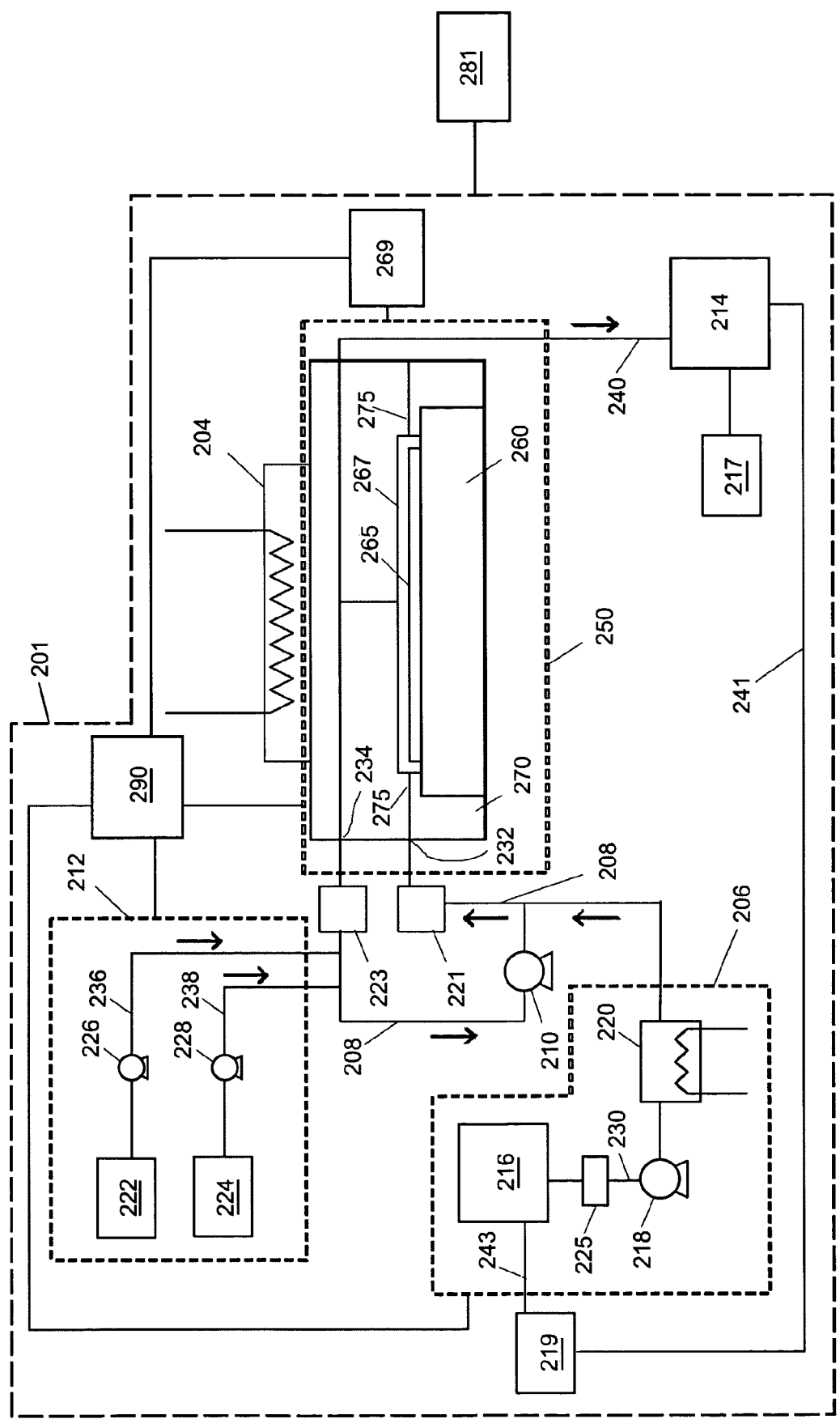
FIG. 2B is a schematic diagram showing a film removal system according to another embodiment of the invention.

FIG. 2B is a schematic diagram showing a film removal system according to another embodiment of the invention. In FIG. 2B, a wet processing system 281 is separate from, but operatively coupled to, a supercritical $CO_2$ film removal system 201. The film removal system 201 can be the same or similar to the supercritical $CO_2$ portion of the film removal system 200 of FIG. 2A, i.e., it can include all components shown in FIG. 2A except for wet processing system 280. The separate wet processing system 281 may operate with its own controller (not shown).

Operations of the film removal systems illustrated in FIGS. 2A and 2B will now be described. Parts of the film removal systems 200 and 201 configured to contain a supercritical $CO_2$ fluid are heated to a temperature above the critical temperature of 31° C., for example by heaters 204 and 220. In one embodiment of the invention, the temperature can be between about 31° C. and about 200° C. Alternately, the temperature can be between about 40° C. and about 120° C. Still alternately, the temperature can be between about 60° C. and about 80° C.

A substrate 265 is provided in the substrate chamber 250 using substrate transfer system 269. Supercritical $CO_2$ fluid is introduced into the circulation loop 208 using $CO_2$ supply vessel 216 and $CO_2$ pump 218. A solvent is introduced into the circulation loop 208 from the solvent supply vessels 222 or 224 via the solvent supply lines 236 or 238 utilizing the first injection pump 226 or the second injection pump 228. The ratio of the solvent to the combination of the supercritical $CO_2$ and the solvent can, for example, be between about 0.1% and about 33% by volume. Next, the system is pressurized to the operating pressure. The supercritical $CO_2$ pressure in the film removal system 200 or 201 can, for example, be between about 1,070 psig and about 6,000 psig. In one embodiment of the invention, the supercritical $CO_2$ pressure can be between about 2,000 psig and about 2,500 psig. The supercritical $CO_2$ fluid containing the solvent is circulated by pump 210 through the processing zone 267 and the circulation loop 208 until the desired film is removed from the substrate 265.

Next, the solvent supply to the circulation loop 208 is discontinued and the processing zone 267 and the circulation loop 208 are continuously flushed for a predetermined time by flowing fresh supercritical $CO_2$ from the $CO_2$ supply vessel 216 through the processing zone 267 and exhausting the fluid to the separating vessel 214, while maintaining pressure above a critical pressure. The predetermined time can, for example, be between about 10 sec and about 1200 sec, and alternately, can be between about 20 sec and about 600 sec, and further alternately, can be between about 30 sec and about 180 sec. The flushing may further include a series of predetermined decompression steps that include sequentially pressurizing the processing zone 267 with supercritical $CO_2$ fluid, and subsequently exhausting supercritical $CO_2$ fluid to the separating vessel 216, while maintaining the pressure in the processing zone 267 and in the circulation loop 208 above the critical $CO_2$ pressure.

Next, the processing zone 267 is depressurized and the substrate 265 removed from the substrate holder 260 by the substrate transfer system 269.

The substrate 265 can be transferred from the substrate chamber 265 to the wet processing system 280 or 281, and vice versa, for further processing. In a wet process for removing a film from a micro-feature on the substrate 265, the substrate 265 is exposed to a wet fluid in the wet processing system 280 or 281. In the case of a dielectric film, the wet fluid is capable of removing the dielectric film from the substrate 265 and can, for example, be a $HF_{(aq)}$ fluid. In the case of a photoresist film, the wet fluid is capable of removing the photoresist film from the substrate 265 and can, for example, be an aqueous mixture of sulfuric acid and hydrogen peroxide. When the wet processing has been performed for a desired amount of time to remove the dielectric film or the photoresist film, the substrate 265 is rinsed with deionized water and dried.

In an exemplary embodiment, wet processing system 280 or 281 is not needed, and supercritical $CO_2$ processing is used to remove both the dielectric film and the photoresist film. In this embodiment, after the dielectric film is removed from substrate 265 by the supercritical $CO_2$ fluid containing a first solvent, for example from solvent supply vessel 222, the processing zone 267 and circulation loop 208 are flushed, as described above, with fresh supercritical $CO_2$ until the first solvent is removed therefrom. Then, without transferring the substrate 265, the second solvent, for example from solvent supply vessel 224, is introduced to the circulation loop 208 for combining with the supercritical $CO_2$ fluid. The supercritical $CO_2$ fluid containing the second solvent is then circulated by pump 210 through the processing zone 267 and the circulation loop 208 until the photoresist film is removed from the substrate 265. The flushing process is then repeated until the second solvent is flushed from the processing zone 267 and circulation loop 208.

FIG. 3A is a flow diagram showing a simplified sequence of a dielectric film removal process according to an embodiment of the invention. In the dielectric film removal process 300, the film removal system 200 in FIG. 2A or the supercritical $CO_2$ film removal system 201 or wet processing system 281 in FIG. 2B can be used for removing the dielectric film from a micro-feature on the substrate 265. At 302, the process is started. At 312, a substrate is provided in a substrate chamber. The substrate has a micro-feature containing a dielectric film on the sidewalls of the micro-feature and a photoresist film covering a portion of the dielectric film. At 320, a dielectric film removal process is performed on the substrate to remove the portion of the dielectric film not covered by the photoresist film. At 332, the process ends.

FIG. 3B is a flow diagram showing a simplified sequence of a photoresist film removal process according to another embodiment of the invention. In the film removal process 350, the film removal system 200 in FIG. 2A or the supercritical $CO_2$ film removal system 201 or wet processing system 281 in FIG. 2B can be used for removing a dielectric film from a micro-feature on the substrate 265. At 352, the process is started. At 362, a substrate is provided in a substrate chamber. The substrate can contain the micro-feature processed by the dielectric film removal process 300 in FIG. 3A. At 372, a film removal process is performed on the substrate to remove the photoresist film from the micro-feature. At 382, the process ends. At least one of dielectric film removal process 300 or photoresist film removal process 350 is performed using supercritical $CO_2$ processing.

In one embodiment of the invention, both the dielectric film removal process 300 and the photoresist film removal process 350 can be performed using supercritical $CO_2$ processing. In another embodiment of the invention, the dielectric film removal process 300 can be performed using supercritical $CO_2$ processing and the photoresist film removal process 350 can be performed using wet processing. In yet another embodiment of the invention, the dielectric film removal process 300 can be performed using wet processing, and the photoresist film removal process 350 can be performed using supercritical $CO_2$ processing.

Figure 4:
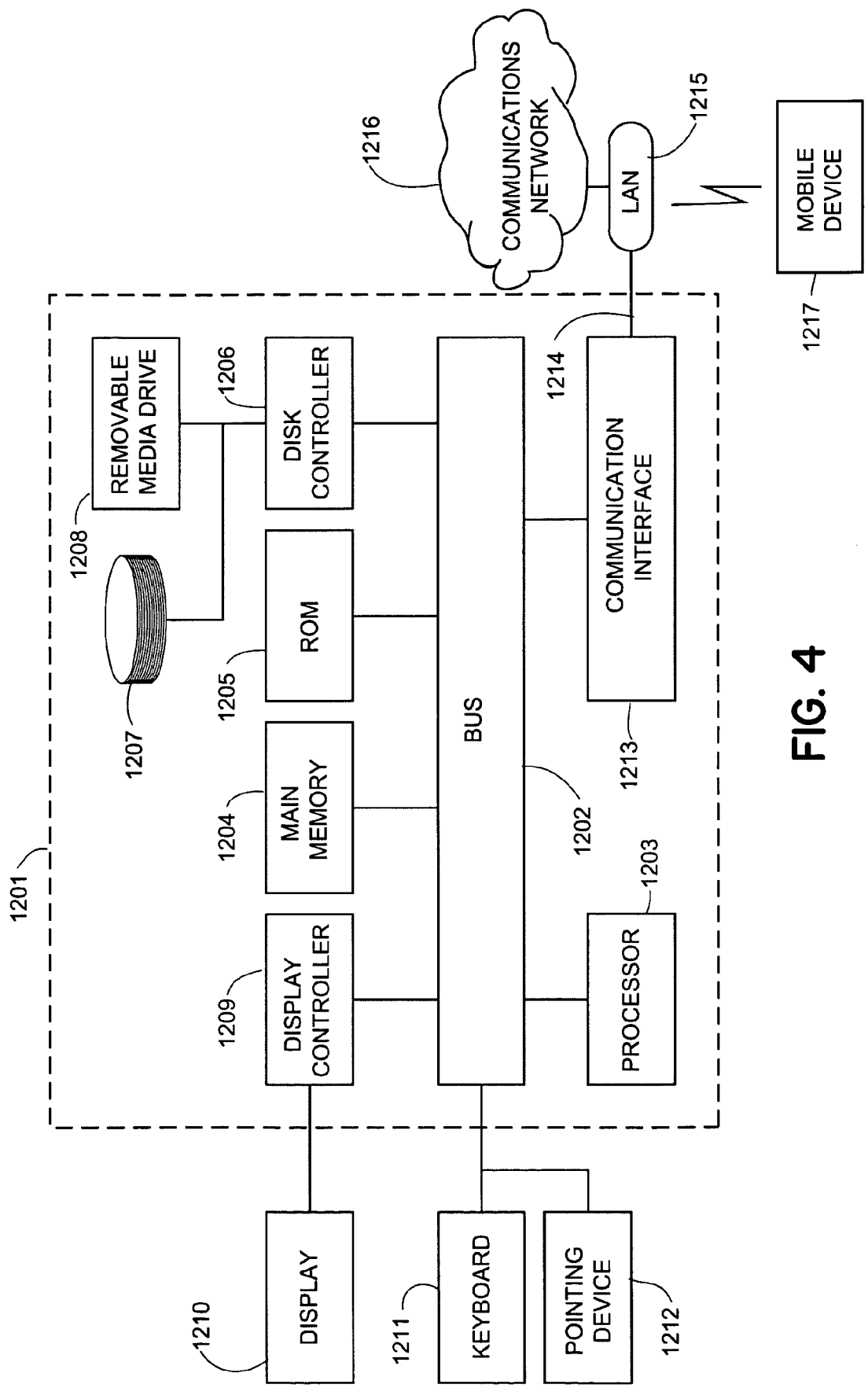
FIG. 4 shows a general-purpose computer that may be used to implement embodiments of the invention.

FIG. 4 illustrates a computer system 1201 with which an embodiment of the invention may be implemented. The computer system 1201 may be used as the controller 290 in the systems 200 and 201 of FIGS. 2A and 2B, respectively, to perform any or all of the functions described above. Computer system 1201 may also be used as a controller (not shown) for wet processing system 281 in FIG. 2B. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs), (not shown). The computer system may also include one or more digital signal processors (DSPs) (not shown), such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1201 may also include a display controller 1209 coupled to the bus 1202 to control a display 1210 for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer (not shown) may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the invention includes software for controlling the computer system 1201, for driving a device or devices for implementing the invention, and for enabling the computer system 1201 to interact with a human user (e.g., processing system personnel). Such software may include, but is not limited to, device drivers, operating systems, development tools, and applications software. Such computer readable media further includes the computer program product of the invention for performing all or a portion (if processing is distributed) of the processing performed in implementing the invention.

The computer code devices of the invention may be any interpretable or executable code mechanism, including but not limited to scripts, interpretable programs, dynamic link libraries (DLLs), Java classes, and complete executable programs. Moreover, parts of the processing of the invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical film (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted

What is claimed is:

1. A method of processing a substrate in a film removal system, the method comprising:
providing the substrate in a substrate chamber of the film removal system, the substrate having a micro-feature containing a dielectric film on a sidewall of the micro-feature and a photoresist film covering a first portion the dielectric film and not covering a second portion of the dielectric film;
performing a first film removal process on the substrate by exposing the substrate to a supercritical $CO_2$ fluid and a first solvent capable of removing the second portion of the dielectric film not covered by the photoresist film;
flushing the substrate chamber with fresh supercritical $CO_2$ fluid after the first film removal process;
performing a second film removal process on the substrate after the flushing by exposing the substrate to the supercritical $CO_2$ fluid and a second solvent capable of removing the photoresist film; and
maintaining the supercritical $CO_2$ fluid at a temperature between about 31° C. and about 200° C. and a pressure between about 1,070 psig and about 6,000 psig during the first and second film removal processes.

2. The method according to claim 1, wherein the performing a first film removal process further comprises:
pressurizing the substrate chamber with the supercritical $CO_2$ fluid;
delivering the first solvent in the supercritical $CO_2$ fluid; and
exposing the substrate to the supercritical $CO_2$ fluid and the first solvent until the second portion of the dielectric film is removed from the sidewall.

3. The method according to claim 1, wherein the performing a first film removal process comprises exposing the substrate to the supercritical $CO_2$ fluid and the first solvent for a time period between about 10 sec and about 1200 sec.

4. The method according to claim 1, wherein the performing a first film removal process comprises exposing the substrate to the supercritical $CO_2$ fluid and the first solvent for a time period between about 20 sec and about 600 sec.

5. The method according to claim 1, wherein the performing a first film removal process comprises exposing the substrate to the supercritical $CO_2$ fluid and the first solvent for a time period between about 30 sec and about 180 sec.

6. The method according to claim 1, wherein the performing a second film removal process further comprises:
pressurizing the substrate chamber with the supercritical $CO_2$ fluid;
delivering the second solvent in the supercritical $CO_2$ fluid;
exposing the substrate to the supercritical $CO_2$ fluid and the second solvent until the photoresist film is removed from the first portion of the dielectric film; and
flushing the substrate chamber with fresh supercritical $CO_2$ fluid.

7. The method according to claim 1, wherein the performing a second film removal process comprises exposing the substrate to the supercritical $CO_2$ fluid and the second solvent for a time period between about 10 sec and about 1200 sec.

8. The method according to claim 1, wherein the performing a second film removal process comprises exposing the substrate to the supercritical $CO_2$ fluid and the second solvent for a time period between about 20 sec and about 600 sec.

9. The method according to claim 1, wherein the performing a second film removal process comprises exposing the substrate to the supercritical $CO_2$ fluid and the second solvent for a time period between about 30 sec and about 180 sec.

10. The method according to claim 1, wherein the micro-feature comprises a trench having a diameter less than about 0.2 microns.

11. The method according to claim 1, wherein the micro-feature comprises a trench having a depth to diameter aspect ratio greater than about 10:1.

12. The method according to claim 1, wherein the micro-feature comprises a trench having a depth to diameter aspect ratio greater than about 50:1.

13. The method according to claim 1, wherein the dielectric film comprises an arsenic-doped silicon dioxide film.

14. The method according to claim 1, wherein the first solvent comprises aqueous HF or HF:pyridine, and wherein the second solvent comprises N-methyl pyrrolidone, diisopropyl amine, triisopropyl amine, or diglycol amine, or a combination of two or more thereof.

15. The method according to claim 14, wherein the second solvent further comprises methanol, ethanol, isopropyl alcohol, benzyl alcohol, acetone, butylene carbonate, propylene carbonate, dimethylsulfoxide, γ-butyrolactone, dimethyl formamide, dimethyl acetamide, ethyl lactate hydrogen peroxide, benzoyl peroxide, oxygen, ozone, nitric acid, acetic acid, or formic acid, or a combination of two or more thereof.

16. The method according to claim 1, wherein the maintaining the supercritical $CO_2$ fluid is at a temperature between about 40° C. and about 120° C.

17. The method according to claim 1, wherein the maintaining the supercritical $CO_2$ fluid is at a temperature between about 60° C. and about 80° C.

18. The method according to claim 1, wherein the maintaining the supercritical $CO_2$ fluid is at a $CO_2$ pressure between about 2,000 psig and about 3,000 psig.

19. The method according to claim 1, wherein a ratio of each of the first and second solvents to the combination of the supercritical CO₂ fluid and the respective first and second solvent is between about 0.1% and about 33% by volume.

20. A computer readable medium containing program instructions for execution on a processor, which when executed by the processor, cause a film removal system to perform the steps in the method recited in claim 1.

21. A method of processing a substrate in a film removal system having a substrate chamber coupled to a circulation loop for continuously circulating a fluid into and out of the substrate chamber, the method comprising:

providing the substrate in the substrate chamber of the film removal system, the substrate having a micro-feature containing a dielectric film on a sidewall of the micro-feature and a photoresist film covering a first portion the dielectric film and not covering a second portion of the dielectric film;

performing an integrated dielectric and photoresist film removal process using a supercritical CO₂ fluid, a first solvent capable of removing the second portion of the dielectric film not covered by the photoresist film, and a second solvent capable of removing the photoresist film, the film removal process comprising:

introducing a flow of the supercritical CO₂ fluid into the circulation loop, introducing a flow of the first solvent into the flow of the supercritical CO₂ fluid in the circulation loop, circulating the flows of the supercritical CO₂ fluid and the first solvent through the substrate chamber via the circulation loop and exposing the substrate to the supercritical CO₂ fluid and the first solvent until the second portion of the dielectric film is removed from the sidewall, discontinuing the flow of the first solvent while continuing the flow of the supercritical CO₂ fluid through the circulation loop and the substrate chamber to flush the first solvent from the circulation loop and the substrate chamber, introducing a flow of the second solvent into the flow of the supercritical CO₂ fluid in the circulation loop and circulating the flows of the supercritical CO₂ fluid and the second solvent through the substrate chamber via the circulation loop until the photoresist film is removed from the first portion the dielectric film, and discontinuing the flow of the second solvent while continuing the flow of supercritical CO₂ fluid through the circulation loop and the substrate chamber to flush the second solvent from the circulation loop and the substrate chamber; and maintaining the supercritical CO₂ fluid at a temperature between about 31° C. and about 200° C. and a pressure between about 1,070 psig and about 6,000 psig during the integrated dielectric and photoresist film removal process.

22. The method according to claim 21, wherein the first solvent comprises aqueous HF or HF:pyridine, and wherein the second solvent comprises N-methyl pyrrolidone, diisopropyl amine, triisopropyl amine, or diglycol amine, or a combination of two or more thereof.

23. The method according to claim 22, wherein the exposing the substrate to the supercritical CO₂ fluid and the first solvent is for a time period between about 10 sec and about 1200 sec and the exposing the substrate to the supercritical CO₂ fluid and the second solvent is for a time period between about 10 sec and about 1200 sec.

24. The method according to claim 21, wherein the micro-feature comprises a trench having a diameter less than about 0.2 microns and a depth to diameter aspect ratio greater than about 10:1.

* * * * *

UNITED STATES PATENT AND TRADEMARK OFFICE
CERTIFICATE OF CORRECTION

PATENT NO. : 7,250,374 B2
APPLICATION NO. : 10/881456
DATED : July 31, 2007
INVENTOR(S) : Glenn Gale et al.

It is certified that error appears in the above-identified patent and that said Letters Patent is hereby corrected as shown below:

Col. 8, line 61, "(not shown)." should read --(not shown)).--.
Col. 10, line 7, "media also may also take" should read --media may also take--.
Col. 10, line 59, "maybe implemented" should read --may be implemented--.
Col. 13, line 16, "portion the dielectric film" should read --portion of the dielectric film--.
Col. 14, line 8, "portion the dielectric" should read --portion of the dielectric--.

Signed and Sealed this

Twenty-fifth Day of March, 2008

JON W. DUDAS
*Director of the United States Patent and Trademark Office*